United States Patent [19]
Horn, III

[11] Patent Number: 5,358,775
[45] Date of Patent: Oct. 25, 1994

[54] FLUOROPOLYMERIC ELECTRICAL SUBSTRATE MATERIAL EXHIBITING LOW THERMAL COEFFICIENT OF DIELECTRIC CONSTANT

[75] Inventor: Allen F. Horn, III, Danielson, Conn.

[73] Assignee: Rogers Corporation, Rogers, Conn.

[21] Appl. No.: 99,245

[22] Filed: Jul. 29, 1993

[51] Int. Cl.$^5$ .............. B32B 3/00; B32B 7/00
[52] U.S. Cl. .............. 428/209; 428/901; 428/405; 428/327; 428/325; 428/331; 428/421; 361/750
[58] Field of Search .......... 428/209, 901, 457, 458, 428/459, 460, 461, 446, 447, 402, 403, 404, 405, 327, 325, 331, 421; 361/748, 750; 252/520; 174/68.5

[56] References Cited

U.S. PATENT DOCUMENTS

| | | | |
|---|---|---|---|
| 4,241,132 | 12/1980 | Pratt | 428/901 |
| 4,849,284 | 7/1989 | Arthur | 428/901 |
| 4,855,266 | 8/1989 | Burn | 252/520 |
| 4,870,377 | 9/1989 | Brown | 174/68.5 |
| 4,996,097 | 2/1991 | Fischer | 428/901 |

Primary Examiner—Patrick J. Ryan
Assistant Examiner—Patrick Jewik
Attorney, Agent, or Firm—Fishman, Dionne & Cantor

[57] ABSTRACT

A high dielectric constant ($K' \geq 4$), low thermal coefficient of dielectric constant ($TCK' \leq 150$ ppm/° C.) electrical substrate material comprises a fluoropolymer (preferably PTFE) filled with particulate ceramic material (powder) which exhibits low loss, comparatively high K' and acceptable TCK'. Examples of such ceramic powders include "class 1" capacitor ceramics. In accordance with an important feature of this invention, it has been discovered that it is insufficient to use only a low TCK' filler (e.g., class 1 capacitor ceramic powder) in the fluoropolymeric binder in order to achieve the desired TCK'. Instead, it has been discovered that the coefficient of thermal expansion (CTE) of the composite must also be sufficiently low (e.g., $\leq 35$ ppm/° C.) to result in a composite which consistently maintains a low TCK'. This low CTE is achieved by adding one or more additional particulate ceramic fillers. These additional fillers have a low CTE and are of a composition which differs from the low TCK' fillers. Examples include silica and alumina. In accordance with still another important feature of this invention, the particle size distribution of the particulate ceramic fillers are carefully controlled to achieve low porosity (e.g., $\leq 15\%$ when the filler content exceeds about 50 volume %).

21 Claims, 3 Drawing Sheets

FLUOROPOLYMERIC ELECTRICAL SUBSTRATE MATERIAL EXHIBITING LOW THERMAL COEFFICIENT OF DIELECTRIC CONSTANT

BACKGROUND OF THE INVENTION

This invention relates generally to filled fluoropolymeric composites. More particularly, this invention relates to a fluoropolymeric composite for use as an electrical substrate material which exhibits both a high dielectric constant (K') and a low thermal coefficient of dielectric constant (TCK'). This electrical substrate material is particularly useful as a laminate for manufacturing microwave circuits.

The electrical performance of electrical circuits and devices is highly dependant on the dielectric constant, K', of the dielectric medium. Thus, when the dielectric constant of a material changes with temperature, the electrical performance of the device will change as well.

A basic treatment of the factors affecting the temperature coefficient of dielectric constant (TCK') of homogeneous compounds is set forth in Equation 1 below:

$$TCK^1 = K^1/3\{(1/\alpha)d\alpha/dT - 3\alpha_L\} \quad (1)$$

where $\alpha$ is the polarizability of the medium, $d\alpha/dT$ is the change in the polarizability with temperature and $\alpha_L$ is the average linear coefficient of thermal expansion (CTE) of the medium. See A. J. Moulson & J. M. Hebert; Electroceramics. P. 223, Chapman and Hall, London, (1990).

This equation demonstrates that there are two basic factors affecting TCK'. The $\{(K'/3)(1/\alpha) d\alpha/dT\}$ term describes the change in K' with temperature due to the change in polarizability of the electrons in the medium. In principal, $d\alpha/dT$ can be a positive, negative or null quantity. A priori prediction of $d\alpha/dT$ based on molecular structure is not presently possible.

The second term of equation 1, $-K' \alpha_L$, is simply the product of the dielectric constant and the average linear coefficient of thermal expansion. This term accounts for the change in the number of polarizable sites per unit volume due to the increase in volume with increasing temperature. With most materials over any reasonably wide temperature range, $\alpha_L$ is a positive quantity so the term, $-K' \alpha_L$ is generally negative.

A review of TCK' data by Moulson and Herbert demonstrate that for many common ceramic dielectrics the $\{(K'/3)(1/\alpha) d\alpha/dT\}$ is small compared to the $-K' \alpha_L$ term. Thus, the TCK' of many materials is a function primarily of the magnitude of the dielectric constant and CTE and TCK' is most often less than zero. This analysis also demonstrates why high K' materials usually possess a high TCK'.

This analysis also indicates that in order to achieve a low TCK' in a high K' compound, the $-K' \alpha_L$ term must be "compensated" by a positive $d\alpha/dT$. Since the Second World War, a segment of ceramic materials research has been devoted to identifying "temperature compensated" high K' dielectric materials. When referring to ceramic materials, "high K'" generally denotes K' values of greater than 30. See E. N. Bunting, Shelton, G. R., Creamer, A. S.; "Properties of Barium-Strontium Titanate Dielectric," J. Amer. Ceram. Soc., vol 30, n.4, pp 114–125, (1947). These efforts have resulted in a number of temperature stable ceramic dielectric materials with K' values in the range of 35–100. The most temperature stable of these materials are specified with a TCK' of 0±30 ppm/° C. and are classified by the EIA as "COG" class ceramic dielectrics. An alternative designation in the capacitor industry for materials which such a TCK' is "NPO." For the most part, these materials are used in the manufacture of "Class 1" capacitors for lower frequency (less than 100 MHz) electronic applications.

A number of such materials are commercially available. The Transelco Division of Ferro Corporation offers a ceramic composition of formula ReBaPb-BiTiO$_3$ under the tradename of "900-NH (K-90 NPO)." When tested at low frequencies, this composition exhibits a K' of 83 and DF of 0.00002 and meets the "NPO" specification for TCK'. According to the manufacturer, no high frequency (greater than 700 MHz) test data were available. Other such materials include "2M101.3 NPO" dielectric ceramic from Radio Materials Corporation of Attica, Ind., comprised of a neodymium and zinc oxide doped barium titanate. This material is also referred to as "N60". As with the Ferro material, this ceramic dielectric was intended for capacitor manufacture and no high frequency test data were available. Another material of this type is "COG-100," a proprietary ceramic capacitor dielectric manufactured by Dimat, Incorporated of Cedarburg, Wisc. As with the previous examples, this ceramic dielectric was intended for capacitor manufacture and no high frequency test data were available.

Some temperature-compensated dielectric ceramics have been identified for high-frequency electronic applications. O'Bryan et al specifically identified a ceramic composition, Ba$_2$Ti$_9$O$_{20}$, with a K' of 39.8, a TCK' of −24 ppm/° C. and a low dielectric loss at microwave (4 GHz) frequencies. See H. M. O'Bryan, Thomson, J., Plourde J. K.; "A new BaO-TiO$_2$ Compound with Temperature-Stable High Permittivity and Low Microwave Loss," Journ. Amer. Ceramic Soc., Vol. 57, No. 10, pp. 450–452, (1974). This material, commonly referred to a barium nanotitanate (BNT), is commercially available as fired shapes from Trans Tech, Inc. (Division of Alpha Industries) for use in high frequency electrical systems. Trans Tech, Inc. also commercially offers a spherical spray-dried BNT powder. BNT is also available as a fine ceramic powder (for Class 1 capacitor manufacture) from Dimat, Inc. Trans Tech also offers a higher K' ceramic as fired shapes, "material type 9000," a barium samarium titanate. Material type 9000 exhibits a K' of 90.5 and a TCK' of approximately 12 ppm/° C. at a frequency of 3 GHz.

In short, a number of "NPO" ceramic compounds are commercially available. Most have been formulated for and are used in the manufacture of ceramic capacitors that are used in comparatively low frequency electronic systems. Those few NPO ceramic compounds that have been formulated and tested for high frequency (>1 GHz) electronic systems are sold as fired shaped and are not broadly applicable for use as fillers in composite materials systems.

Many polymeric composite materials are presently available for use as a laminate for microwave frequency electronic applications. Prevalent amongst these materials are composite systems based on PTFE (poly(tetrafluoroethylene)) and other fluoropolymers (such as FEP (poly(tetrafluoroethylene-co-hexafluoropropylene) and DuPont's PFA). Fluoropolymeric composites are desirable due to their excellent high-frequency electrical properties and excellent high temperature and solvent resistance. When referring to organic polymer based composite circuit substrate, low K' generally denotes a K' value of less than 3.0, while high K' implies a value of greater than about 4.0.

A common class of fluoropolymeric composite microwave laminates are those that are reinforced in the XY plane with either woven glass cloth or random glass microfiber. Examples of such materials are Rogers Corporation's RT/duroid ® 5880 and Ultralain ® 2000 and the material described in U.S. Pat. 4,886,699, assigned to the assignee hereof and incorporated herein by reference. The dielectric constant values of these types of materials commonly ranges from 2.17 to about 2.65. This class of materials exhibits comparatively high Z-axis coefficients of thermal expansion (CTE), ranging from +125 to +250 ppm/° C. In spite of the high Z-axis CTE of these materials, the thermal coefficient of K' is relatively low. The TCK' of RT/duroid 5880 has been measured to be approximately −75 ppm/° C. at a frequency of 10 GHz over the temperature range of 20° C. to 250° C. This comparatively good TCK' is due in part to the relatively low K' of this class of materials.

Another type of fluoropolymer composite useful for microwave laminates is described in U.S. Pat. No. 4,849,284, assigned to the assignee hereof and incorporated herein by reference. A preferred embodiment of this invention is sold by Rogers Corporation to the microwave circuit board industry under the trademark RT/duroid ® 6002. This composite material consists of fused amorphous silica, PTFE and E-glass microfibers. It exhibits a K' of 2.94, a Z-axis CTE of about 24 ppm/° C. and a TCK' of about +20 ppm/° C. The small value for the TCK' allows for stable electrical performance of circuits made on RT/duroid 6002 over a wide range of temperature. This feature is highly valued by designers of microwave circuits.

Other commonly assigned patents and patent applications describing fluoropolymer composite materials of this type include U.S. Pat. Nos. 5,024,871; 5,061,548; 5,077,115; 5,149,590; 5,194,326 and 5,198,295 and U.S. patent application Ser. Nos. 07/641,427; 07/703,633; 07/704,983; 07/705,624; 07/705,625; 07/808,206 and 07/897,244. Other patents describing materials of this type include U.S. Pat. Nos. 4,985,296 and 5,055,342.

While the aforementioned fluoropolymeric composite materials generally exhibit low dielectric constant, there is also a need for comparatively high K' (K'≧4) fluoropolymeric composite materials such as those described in U.S. Pat. No. 4,335,180, (which is assigned to the assignee hereof and incorporated herein by reference) as well as U.S. Pat. No. 4,996,097. High K' materials of this type are sold by Rogers Corporation under the trademark RT/duroid 6006 (K'=6.15) and RT/duroid 6010 (K' of 10.2 to 10.8). This class of materials is generally made by adding titania ceramic filler to increase the K' of the material. These high K' materials exhibit z-axis CTE's of about +45 ppm/° C. to +80 ppm/° C. and TCK' values of about −500 ppm/° C. to −600 ppm/° C. The major factor in causing the high TCK's of this class of materials is the high TCK' of the ceramic filler that is added to modify the K' (although as is demonstrated in the examples below, it has been discovered by the inventor herein that the CTE also plays a major role). Titania (TiO2) itself exhibits a TCK' of approximately −750 ppm/° C.

Presently, applicants are not aware of any fluoropolymeric based composite for use as an electrical substrate material which exhibits both high K' and low TCK'. However, applicants are aware of other non-fluoropolymeric based composites useful as microwave dielectric materials which have temperature stable high dielectric constant properties. Most notable for this characteristic is the polybutadiene based composite described in commonly assigned U.S. Pat. No. 5,223,568 (all of the contents of which are incorporated herein by reference) and sold by Rogers Corporation under the trademark TMM ®. Such TMM ® microwave substrate comprise a thermoset matrix (predominately poly (1,2-butadiene) liquid resin that is highly crosslinked) and a ceramic filler blend of silica and barium nanotitanate (BNT). The BNT powder exhibits a mean particle size of approximately 2.5–4.0μ. Because of the nature of the TMM ® laminate mixing process and liquid resin system, unlike PTFE composites, it exhibits no porosity at filler loadings of up 65 volume %, even with this small particle size distribution filler.

Unfortunately, it has been determined that merely adding such BNT filler (or other similar class 1 capacitor ceramic powders) into PTFE (as in the TMM ® polybutadiene based laminates) composites leads to unacceptably high porosity and therefore exhibits unacceptable uptake of organic solvents and low surface tension surfactant treated aqueous solutions used during circuit board manufacture. The uptake of such solvents and solutions can lead to processing difficulties, long term reliability problems and increased dielectric loss if they are not fully removed before further processing. While TMM ® laminates do exhibit the important high K' and low TCK', fluoropolymer based laminates exhibiting such properties are nevertheless desired because, in general, a fluoropolymer (e.g., PTFE) composite will exhibit lower loss, higher peel strength and superior high temperature resistance relative to polybutadiene based composites when used as an electrical substrate material.

SUMMARY OF THE INVENTION

The above-discussed and other problems and deficiencies of the prior art are overcome or alleviated by the particulate ceramic filled fluoropolymeric composite of the present invention. In accordance with the present invention, a high dielectric constant (K'≧4), low thermal coefficient of dielectric constant (TCK'≦150 ppm/° C.) electrical substrate material comprises a fluoropolymer (preferably PTFE) filled with particulate a ceramic material (powder) which exhibits low loss, high K' and acceptable TCK'. Examples of such ceramic powders include the class 1 capacitor ceramics described above.

In accordance with an important feature of this invention, it has been discovered that it is insufficient to use only a low TCK' filler (e.g., NPO ceramic powder) in the fluoropolymeric binder in order to achieve the desired TCK'. Instead, it has been discovered that the coefficient of thermal expansion (CTE) of the composite must also be sufficiently low (e.g., ≦35 ppm/° C.) to result in a composite which consistently maintains a low TCK'. This low CTE is achieved by adding one or more additional particulate ceramic fillers. These additional fillers have a low CTE and are of a composition which differs from the low TCK' fillers. Examples include silica and alumina.

In accordance with still another important feature of this invention, the particle size distribution of the particulate ceramic fillers are carefully controlled to achieve low porosity (e.g., ≦15 volume % when the filler content exceeds about 50 volume Maintaining low porosity is particularly difficult in fluoropolymeric composites and is necessary in order to minimize solvent uptake during processing the substrate onto a microwave circuit.

In a preferred embodiment of this invention, the XY plane CTE is closely matched to that of copper to achieve good "dimensional stability" upon etch and bake.

The ability of the present invention to maintain a low TCK' in a high K' fluoropolymer composite is highly desirable to designers of microwave circuitry in that microwave circuit laminates made from such a composite lead to cost reduction of microwave devices (by eliminating temperature compensation devices) and improving the performance of the microwave devices.

The above-discussed and other features and advantages of the present invention will be appreciated and understood by those of ordinary skill in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

The filled fluoropolymer composite of the present invention comprises a fluoropolymeric matrix (60 to 25 volume %) filled with a combination of different particulate ceramic fillers (40 to 75 volume %) including one or more high K', low TCK' particulate ceramic filler and one or more low CTE particulate ceramic fillers. In general, the term "high" K' means a K' of ≦30, the term "low" TCK' means a TCK' which is lower in absolute magnitude than that of titania and is preferably 0+/−30 ppm/° C. The term "low" CTE means ≦15 ppm/° C. The low CTE ceramic filler is present in an amount effective to lower the overall CTE to a value such that the composite TCK' is ≦150 ppm/° C. and preferably ≦50 ppm/° C. over the operating temperature range in which the electrical substrate is normally used, for example, −55° to +125° C. The composite K' value is preferably ≧4 and the composite CTE is <35 ppm/° C. Preferably, the particle size distribution of the particulate ceramic fillers should be effective to render the porosity of the composite less than 15% by volume (and preferably less than 10%) when the ceramic filler content exceeds about 50 vol. %. The ceramic filler is preferably coated with a hydrophobic coating.

Figure 1:
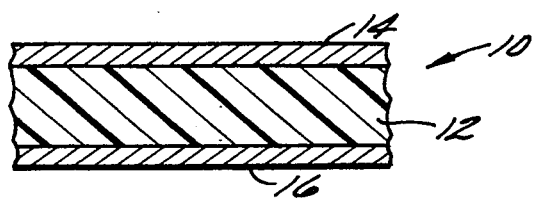
FIG. 1 is a cross-sectional elevation view of the electrical substrate material of this invention formed into a diclad laminate.

Referring to FIG. 1, the filled fluoropolymeric composite is depicted in the form of a circuit laminate 10 where the composite 12 comprises a dielectric sheet laminated between conductive sheets 14, 16 (preferably metal sheets such as copper or aluminum).

The fluoropolymeric matrix is most preferably polytetrafluoroethylene (PTFE), but may also comprise one or a combination of the following fluoropolymers: a copolymer of tetrafluoroethylene and perfluoroalkyl vinyl ether (PFA), a copolymer of hexafluoropropylene and tetrafluoroethylene (FEP), poly (ethylene-cochlorotrifluoroethylene), chlorotrifluoroethylene, poly(ethylene-co-tetra fluoroethylene) and poly(vinylidene fluoride).

The high K', low TCK' particulate ceramic filler is preferably one or a combination of the aforementioned class 1 ceramic capacitor materials. In order to achieve the desired TCK' of less than about 150 ppm/° C. over a range of at least 20° to 50° C. in the composite substrate, the TCK' of the high K' material is believed to be less than about 500 ppm/° C. More preferably, the high K' low TCK' material should exhibit as low a TCK' as possible, while also possessing low dielectric loss. Examples include, but are not limited to, $ReBaPbBiTiO_3$ available from the Transelco Division of Ferro Corporation under the tradename "900-NH (K-90 NPO)"; neodymium and zinc oxide doped barium titanate available from Radio Materials Corporation under the tradename "2M101.3 NPO" or simply "N60"; a proprietary ceramic material sold by Dimat, Inc. under the tradename "COG-100" and barium nanotitanate (BNT) commercially available from Trans Tech, Inc. (Division of Alpha Industries) and Dimat, Inc. All of these ceramic materials meet the "NPO" specifications of 0+/−30 ppm/° C. The K' of these ceramic materials is in the range of 35–100.

The low CTE low K' particulate ceramic filler is any ceramic filler exhibiting a CTE of about 15 ppm/° C. or less. Preferred examples include silica and alumina. Other examples include various low loss glasses and steatites, beryllium oxide (BeO), aluminum nitride (AlN), Foresterite ceramics and boron nitride (BN). Fused amorphous silica is the most preferred ceramic filler due to its extremely low CTE (0.6 ppm/° C.) and low loss.

With regard to the mixture of ceramic fillers, the high K', low TCK' component preferably comprises 5% to 100% of the total filler mixture, depending on the desired K' of the final composite. However, the limiting criteria for the relative amounts of ceramic filler is that mixture which achieves a composite K' of ≧ 4, a composite TCK' of less than about 150 ppm/° C. and a composite CTE of about 35 ppm/° C. or less.

Preferably, the particle size distributions (PSD) of the ceramic fillers are effective to maintain a composite porosity of less than about 15 volume % at filler levels of 50 vol. % or higher. To achieve low porosity in a ceramic powder filled fluoropolymer composite, the ceramic powder must exhibit a comparatively high packing fraction. As described in Particle Packing Characteristics, Randall M. German, Metal Powder Industries Federation, Princeton, N.J. (1989), many of the properties of the powder affect its packing fraction.

One of the key properties is the width of the particle size distribution. In general, wider PSD's lead to high packing fractions.

The mean particle size also affects particle packing, with larger mean particle size generally leading to a higher packing fraction. Often, smaller particle mean diameter samples also exhibit a narrower PSD. Furthermore, the greater interparticle attraction forces and friction (due to higher specific surface area of the smaller PSD samples) lead to poorer packing of the powder.

Particle shape and morphology are also important. More spherical particles generally lead to better packing, as do particles with "smoother" surfaces. It is also important the particles themselves are not porous, or if so, that the porosity is inaccessible.

As illustrated in the examples below, high packing fraction filler is particularly important in formulating dense, non-porous fluoropolymer composites. This is probably due to the high viscosity of the resin compared to that of thermoset systems such as described in the aforementioned U.S. Pat. No. 5,223,568. As demonstrated in the examples, an important feature of this invention was the ability to obtain low TCK' ceramic powders with dense porosity-free particles in an acceptable PSD to yield low porosity fluoropolymer composites.

The hydrophobic coating of the present invention may comprise any coating material that is thermally stable, exhibits a low surface energy and improves the moisture resistance of the composite of the present invention. Suitable coating materials include conventional silane coatings, titanate coatings and zirconate coatings; and are described in U.S. Pat. Nos. 4,849,284; 5,024,871 and 5,149,590 all of which are incorporated herein by reference. Preferred silane coatings include one or a combination for the following: phenyltrimethoxysilane, phenyltriethoxysilane, (3, 3, 3-trifluoroprophyl) trimethoxysilane, (trideca-fluoro-1,1,2,2-tetrahydrodecyl)-1,1 treithoxysilane (heptadecafluoro-1,1,2,2-tetrahydrodecyl)-1-triethoxysilane and mixtures thereof. Suitable titanate coatings include: neopentyl (diallyl) oxytrineodecanoyl titanate, neopentyl-(diallly) oxytri (dodecyl) benzene-sulfonyl titanate and neopentyl-diallyl) oxytri (dioctyl) phosphate titanate. Suitable zirconate coatings include: neopentyl (diallyl) oxytri (dioctyl)-phrophosphate zirconate and neopentyl (diallly) oxytri-(N-ethylenediamino) ethyl zirconate.

The hydrophobic coating is used in an amount effective to render the surfaces of the filler particles hydrophobic and compatible with the matrix material. The amount of coating relative to the amount of inorganic particles coated will vary with the surface area coated and density of the inorganic particles. Preferably, the coated inorganic particles of the present invention include from about 0.5 part by weight (pbw) hydrophobic coating: 100 pbw ceramic particles to about 15 pbw hydrophobic coating: 100 pbw ceramic particles.

The filler materials are coated by agitating the filler materials in a solution of the coating material, removing the filler material from the solution and finally heating the filler material to evaporate solvents from the coating and to react the coating with the surface of the filler material.

A composite material of the present invention having a blended fluoropolymer matrix may be compounded by the procedure outlined in U.S. Pat. Nos. 4,355,180 and 4,849,284, the disclosures of which are incorporated herein by reference. Briefly, the process includes mixing coated ceramic particles with a fluoropolymer dispersion, coagulating the mixture using a flocculating agent, filtering the coagulated mixture and then consolidating the mixture to form a composite substrate at elevated temperature (600° F. to 800° F.) and pressure (100 psi to 3000 psi). Alternatively, a fluoropolymer powder may be mixed with the coated filler particles and the mixture so formed may be consolidated under elevated temperature and pressure to form the composite substrate. In still another alternative method of manufacture, the fluoropolymer composite is cast as described in aforementioned U.S. Application 07/704,983 filed May 24, 1991, the contents of which are incorporated herein by reference.

EXAMPLES

The following non-limiting examples of high K' fluoropolymer-ceramic composites illustrate the importance of the choice of filler type and morphology, filler particle size distribution (PSD) and CTE of the final composite material. The majority of properties reported herein were measured in accordance with the IPC-TM-650 Test Methods manual. The TCK' values reported herein were measured by stripline resonance at a resonant frequency of approximately 10 GHz. The specific method used is similar to that described in IPC-TM-650 2.5.5.5, but modified in the following manner to allow heating and cooling of the test fixture:

The stripline resonator patterns (FIG. 2) were similar to those described in Table 1 of IPC. TM650 2.5.5.5. The resonator lengths were reduced to obtain two node resonance at about 10 GHz. Two node resonance was chosen to minimize the size of the resonator strip to minimize temperature gradients across it. Longer cards (3.75"×2.8") and longer probe lines were used to accommodate the physical requirements of the heating and cooling fixture. The majority of the samples were approximately 0.050" thick.

For the present testing, the "pattern card" described in IPC. TM650 2.5.5.5 was eliminated and the resonator pattern was etched directly on one of the cards to be tested. The cooper foil ground plane was left intact on the reverse side. The second test card was etched free of copper on one side and left copper clad on the other. Since elimination of the pattern card reduced the ground plane spacing, the width of the probe lines was decreased from that recommended in the IPC test to maintain 50 Ωimpedance.

Figure 3:
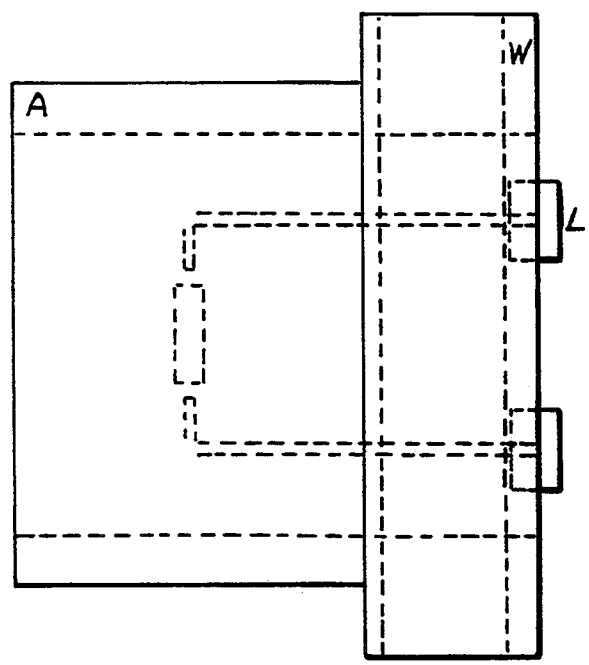
FIG. 3 is a side elevation view of the specimen of FIG. 2 in a clamping fixture.

Referring to FIG. 3, the two sample cards to be tested were assembled into the stripline configuration with 3 mm coaxial cable-to-stripline launcher fittings "L" . The area "A" in FIG. 3 shows the section of test cards that was held between the temperature controlled press platens. The water cooled aluminum blocks "W" in FIG. 3 maintained the coax-to-stripline launcher fittings at 20° C. throughout the experiment.

Figure 2:
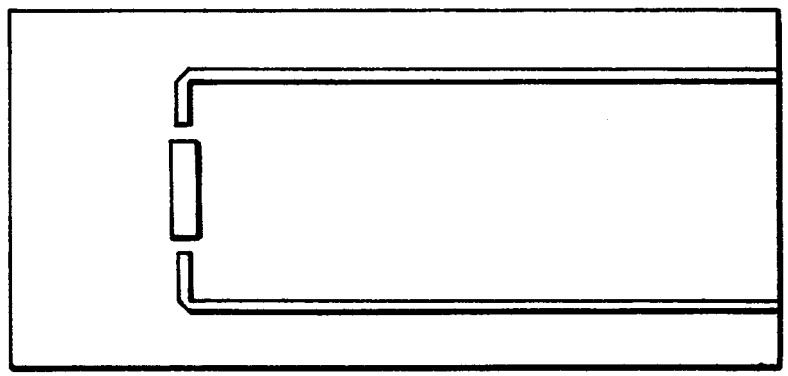
FIG. 2 is a plan view of a resonator pattern used in testing a test specimen for TCK'.
Figure 4A:
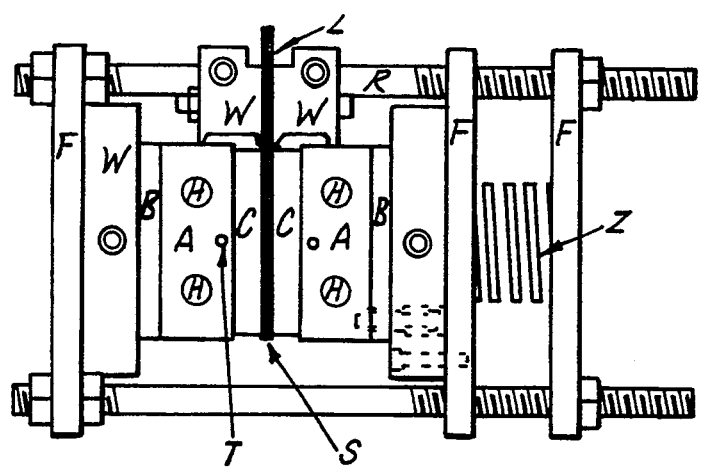
FIGS. 4A and 4B are respective top and side views of a device for testing TCK'.
Figure 4B:
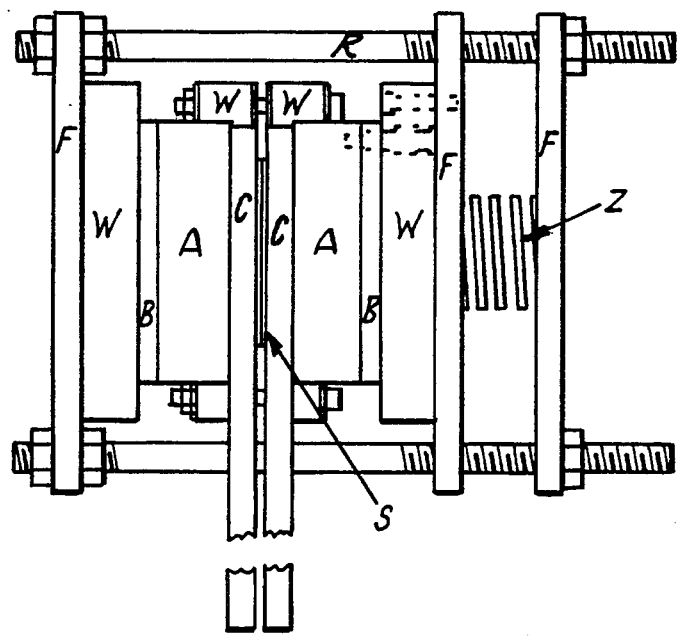

The sample card assembly was inserted in the aluminum platen press detailed in FIGS. 4A and 4B. A constant pressure of about 80 psi was maintained on the sample card assembly by a measured 14.3 mm compression of the previously calibrated spring "Z" . The coax connections were then made to the "automated permittivity test setup" as shown in FIG. 2 of the IPC test method. The test was controlled by a computer program. The two node resonant frequency was identified at room temperature. In the case of any ambiguity, a graph of transmitted power versus frequency from 2 GHz to 14 GHz was constructed by the computer program and the one, two, three and four node peaks were identified by the operator to be certain that the two node peak was correctly chosen.

Referring now to FIGS. 4A and 4B, respective top and side views of device for measuring TCK' is shown. The following Table identifies the various components of the testing device.

TABLE

| | |
|---|---|
| A | 64 × 38 × 25 mm aluminum clamp block (2) with controlled temperature |
| B | barrier material (2) to heat flow between A and W |
| C | copper bar 9.5 × 38 × 457 mm (2) for cooling S and A |
| F | frame plates (3) of steel for applying clamp force |
| H | holes in A for electric cartridge heaters |
| L | location for stripline launcher to coaxial adapter |
| R | threaded tie rods (2) for adjusting clamp force |
| W | water flow in aluminum blocks keeps F and L at 20° C. |
| Z | compression spring for controlled clamp force |
| S | test specimen, pattern card and cover board |
| T | thermocouple well in A |

Subambient Testing

The subambient portion of the testing was performed first. The cooling was provided by immersing the 1.5"×18"(38×457 mm) copper bars ("C" in FIGS. 4A and 4B) in a Dewar flask filled with liquid nitrogen (LN2). During the subambient testing, the entire test fixture was covered with a plastic bag that filled with the evaporating LN2 which purged the area of ambient air and prevented frost build up. Adequate temperature control (+0.5° C.) was obtained for the duration of each temperature tested simply by manually controlling the LN2 level in the Dewar flask.

Cooling water was supplied to all four "W" aluminum blocks throughout the test to maintain the press frame and coax-to-stripline launcher temperature at 20° C.

The resonant frequency, power level and 3 db points were recorded by the computer program for each data point. Data were taken at 10° or 20° C. increments from 20° C. to −100° C. as the stripline resonator was cooled. The data points were repeated during heating back to room temperature.

Heated testing

For testing at temperatures above ambient, the copper bars in FIGS. 4A and 4B were removed from the setup. Two 200W cartridge heaters "H" were inserted in each aluminum block "A" and connected to a PID temperature controller.

As during the subambient run, cooling water was supplied to the four "W" aluminum blocks throughout the test to maintain the press frame and coax-to-stripline launcher temperature at 20° C.

Most data were taken at 10°-20° C. increments from 20° C. to 250° C. The PID temperature controllers stabilized the temperature at each setting to ±0.5° C. The data points were again repeated during the down ramp back to room temperature.

EXAMPLE 1

The following example demonstrates the importance of both filler morphology and PSD in obtaining a fluoropolymer composite dielectric suitable for a microwave circuit substrate. These experiments were conducted using BNT ceramic powders, but are equally applicable to other NPO ceramic compositions.

The commonly supplied PSD of BNT from Dimat, Inc. was used in the preparation of samples A and B. This filler exhibits a median diameter of about 5–6μ with 85% of the mass of the distribution less than about 12μ and 15% less than 2.0μ as measured by the Shimadzu SA-CP4 Particle Size analyzer.

Both of these samples were formulated to contain a total filler content of about 60 volume % in order to obtain a low CTE. Sample C was prepared using 3702 grams of silane-treated BNT filler, 1182 grams of DuPont Teflon®T67 PTFE fine powder and 1138.6 grams of dipropylene glycol as a lubricant. These raw materials were combined in a Patterson Kelly Vee blender and processed into sheet stock in the manner described in the '284 and '180 patents. The sheets were laminated to copper foil in a hydraulic flat bed press at a pressure of 1700 psig and a temperature of 700° F.

Sample B contained approximately 50 volume % of a similar sample of BNT and an additional 10 volume % of Derfica FB-35 fused amorphous silica. The FB-35 silica is a dense, pore-free particle with a mean particle diameter of about 10μ with 85% less than 29μ and 15% less than 4μ. The B formulation consisted of 3442.3 grams of BNT, 330 grams of FB-35, and 1320 grams of Teflon T67. 40 grams of Dow Corning DC-6124 silane was added to the furnish with the 714 grams of DPG, also containing 11 grams of water and 6 drops of 10% HCl. This sample was processed into copper foil clad laminate by the same method as sample A.

The K' specific gravity (Sp.G.) and xylene absorption porosity of these samples is reported in table 1. Xylene absorption porosity is measured by determining the amount of xylene absorbed by 2"×3"×0.025" samples during two hour immersion in the solvent. Since it is known that neither the filler nor the fluoropolymer matrix absorb xylene, the amount of xylene taken up by the sample is representative of the submicroscopic porosity that exists at the filler-matrix interface. As shown by the data in table 1 for samples A and B, the measured Sp.G. is considerably lower than the value calculated based on the raw materials and the xylene absorption porosity is in the range of 9–12 vol. %. Sample B exhibits a lower porosity and closer-to-calculated Sp.G. due to the fact that 10 volume % of the BNT with inappropriate PSD has been replaced with the same volume of appropriately sized FB-35 silica, with the correct morphology.

The failure to make a high density composite by this method was unexpected, based on results obtained with thermoset matrices such as the polybutadiene based TMM composites. A similar recipe, using liquid resin and thermoplastic rubber as the polymer matrix and compounded on a two roll mill yielded a completely dense composite with practically no measurable porosity. The sensitivity of composite density to filler properties is evidently considerably higher in fluoropolymer systems; and therefore the simple introduction of low TCK' ceramic filler into a fluoropolymeric matrix will not yield a desirable high K', low TCK' composite.

In an attempt to make a composite with higher Sp.G. and lower porosity, a larger mean particle size sample of BNT (TT lot 198) was obtained from Trans Tech, Inc. This material has been formulated by its manufacturer as a filler for composite materials by spray-drying and firing smaller particle BNT. The median particle size of TT lot 198 spray-dried BNT was 21μ, with 85% less than 39μ and 15% less than 9.9μ. Sample C. consisted of 3520 grams of silane-treated TT lot 198 BNT, 1124 grams of DuPont Teflon T67, and 1219 grams of DPG, processed into copper clad laminate as described above. Sample C data in table 1 show that the Sp.G. was even lower (2.85) and the porosity even higher (19.1 vol. %) than with the Dimat small particle filler.

Further investigation, using scanning electron microscopy (SEM) and mercury porosimetry demonstrated the cause; the particles of TT 198 themselves exhibited approximately 7% porosity, due to incomplete sintering upon firing. Thus, even though the PSD was appropriate for producing a high Sp.G./low porosity laminate, it was not achieved due to incorrect individual particle morphology.

Next, a special experimental sample of BNT was obtained from Trans Tech, Inc. by fully sintering the fired powder and grinding the resulting large hard pieces back to a desirable PSD. This sample of D-8812 (lot 212) exhibited a median particle size of 14.4μ, with 85% less than 35μ and 15% less than 1μ. SEM analyses of these particles showed them to be glassy in nature with no visible pores. Sample D was produced with 3442.5 grams of D-8812 (lot 212), 330 grams of FB-35, 1320 grams of DuPont T67, with 40 grams of DC-6124, 11 grams of water, 6 drops of 10% HCl and 714 grams of DPG by the aforementioned fabrication methods into copper clad laminate. As shown in table 1 below, this sample exhibited a specific gravity of 96.8% that of the calculated value and only 3.7 vol. % porosity as measured by xylene absorption.

This example demonstrates the unexpectedly strong dependance of the Sp.G. and porosity of a ceramic powder-filled fluoropolymer composite. It also shows the ability, by properly specifying both PSD and individual particle morphology to obtain composites with acceptable Sp.G. and porosity.

It will be appreciated by one skilled in the art that the concepts demonstrated by this example can apply to any ceramic filler or mixture of fillers in a fluoropolymeric matrix. It would also be similarly appreciated that the exact details of the optimum particle size distribution could depend on the specific ceramic filler under consideration. However, high individual particle density or at least, inaccessible particle porosity as measured by mercury porosimetry will always be desired for a low porosity composite.

TABLE 1

Examples of the importance of Filler Morphology and PSD on composite density and porosity

| Sample | K' | Calc. Sp.G. | Meas. Sp.G. | Xylene abs. porosity |
|---|---|---|---|---|
| A | 8.63 | 3.63 | 3.09 | 12.2 vol. % |
| B | 8.11 | 3.39 | 3.06 | 8.8 vol. % |
| C | 8.44 | 3.63 | 2.85 | 19.9 vol. % |
| D | 8.56 | 3.39 | 3.28 | 3.7 vol. % |
| Thermoset matrix (prior art) | 9.20 | 2.78 | 2.78 | 0.2 vol. % |

EXAMPLE 2

This example illustrates the unexpectedly high degree of importance of the overall composite CTE on the TCK' when using NPO ceramic fillers. As is demonstrated by the data below, comparatively small changes in the composite formulation result in surprisingly significant changes in the TCK'.

As points of comparison, the K', CTE and TCK' for two commercial "high K'" microwave substrates, Rogers' RT/duroid 6010 and RT/duroid 6006 are listed in table 2. RT/duroid 6010 is a PTFE composite of approximately 50 volume % titania and glass micro fiber. RT/duroid 6006 contains a lower volume fraction loading of titania since it is targeted to a K' value of approximately 6.2.

A PTFE-composite sample was prepared containing 50 volume % COG-100 NPO ceramic powder from Dimat, Inc. This sample, E, consisted of 4417.5 grams of COG-100, 1635 grams DuPont T67, 32.7 grams Dow Corning DC-6124, 9 grams of water, 6 drops of 10% HCl and 705 grams of DPG lubricant blended and processed into copper clad laminate as described in example 1. As shown in table 2, this composite exhibited a K' of 11, z-axis CTE of 35 ppm/° C. and TCK' of −186 ppm/° C. Although this TCK' was a considerable improvement over that exhibited by the standard commercial materials, it was still considerably higher in absolute magnitude than desired.

A second PTFE-composite sample was prepared with the same 50 volume % of COG-10.0, but with an additional 10 volume % of FB-35 fused amorphous silica replacing 10 volume % of the PTFE matrix. This sample, F consisted of 4417.5 grams of COG-100, 327 grams of FB-35, 1308 grams of DuPont T67, 40 grams of Dow Corning DC-6124, 11 grams of water, 6 drops of 10% HCl and 714 grams of DPG blended and processed into copper clad laminate as previously described. Sample F exhibited a K' of 10.8. a z-axis CTE of 17 ppm/° C. and a remarkably low TCK' value of −35 ppm/° C. It was highly unexpected that such a small change in formulation could result in nearly a six-fold reduction in TCK'.

Figure 5:
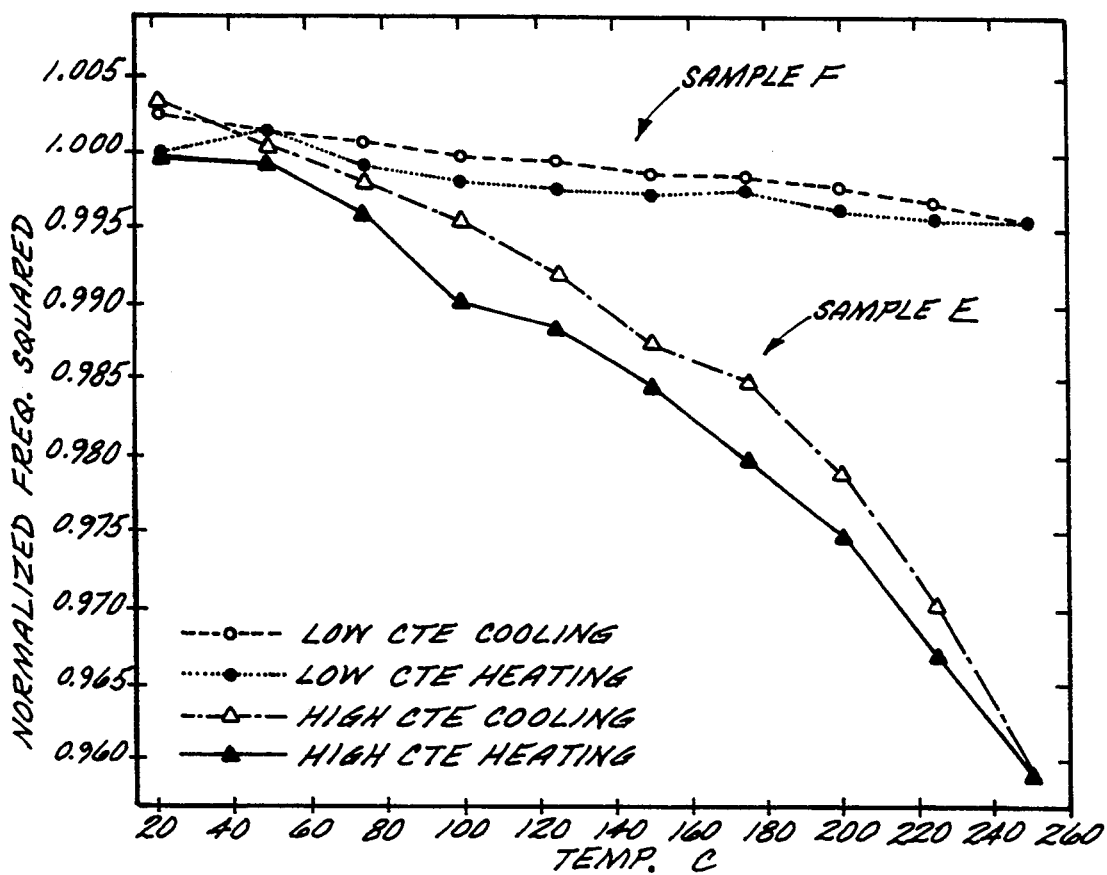
FIG. 5 is a graph depicting the TCK' with low and high CTE composites.

The square of the ratio of the resonant frequency to that at 22° C. is plotted against temperature in FIG. 5 for samples E and F. This plot graphically shows the significant improvement in TCK' of the composite caused by the addition of the small amount of fused silica to reduce the composite's CTE.

TABLE 2

Example of the importance of Composite CTE on the composite TCK' with NPO ceramic fillers

| Sample | K' | CTE −55 to +125° C. | TCK' +22 to +250° C. |
|---|---|---|---|
| RT/duroid 6010.2 | 10.2 | ≈40 ppm/°C. | −525 ppm/°C. |
| RT/duroid 6006 | 6.2 | 74 ppm/°C. | −463 ppm/°C. |
| E | 11.0 | 36 ppm/°C. | −186 ppm/°C. |
| F | 10.8 | 17 ppm/°C. | −35 ppm/°C. |

EXAMPLE 3

This example demonstrates the use of fillers other than fused amorphous silica to control the overall composite CTE and hence, the TCK'.

Samples G and H were prepared to be analogous to F, but demonstrating the use of powdered alumina (A1203) in place of silica to reduce the composite CTE and lower the TCK'. Sample G contained 50 volume % COG-100 with an additional 10 volume % of Norton Company's "EGPA-7μ" untreated alumina powder. Sample H contained 50 volume % COG-100 with an additional 10 volume % of Norton Company's "EPGA-15μ" untreated alumina powder. EPGA-7μ exhibits a median particle diameter of 7μ while EPGA-15μ exhibits a median particle diameter of 15/μ. The G sample was prepared as previously described using 4417.8 grams of COG-100, 583.4 grams of EGPA-7μ, 1319.8 grams of DuPont T67 PTFE, 40 grams of DC-6124, 11 grams of water, 6 drops of 10% HCl and 1014 grams of DPG. The H sample was prepared as previously described using 4417.7 grams of COG-100, 596.7 grams of EGPA-15μ, 1320.1 grams of DuPont T67 PTFE, 40 grams of DC-6124, 11 grams of water, 6 drops of 10% HCl and 864 grams of DPG.

The data in table 3 demonstrate that alumina was even more effective than fused amorphous silica at improving the TCK' of the composite. Both samples exhibited a ten-fold reduction in TCK' over that of the composite without the additional filler. While the majority of the reduction in TCK' is believed to be due to the reduced CTE of the composite (inferred from the total filler content), the additional improvement over that of the previous example with fused silica is believed to be due to the higher K' of alumina and its positive value for TCK'.

TABLE 3

Example of the use of fillers other than silica for Control of Composite TCK'

| Sample | K' | CTE −55 to +125° C. | TCK' +22 to +250° C. |
|---|---|---|---|
| E | 11.0 | 36 ppm/°C. | −186 ppm/°C. |
| G | 10.4 | ≈20 ppm/°C. | −18 ppm/°C. |
| H | ≈10.4 | ≈20 ppm/°C. | −18 ppm/°C. |

EXAMPLE 4

The following example demonstrates the importance of CTE control and total filler content on producing a microwave substrate with excellent TCK' using an NPO ceramic powder other than "COG-100."

Sample I was prepared with about 50 volume % of the Transelco K-90 NPO ceramic powder. Sample I consisted of 3800 grams of K-90, 1500 grams of DuPont T67 PTFE, 35 grams of DC-6124, 9.6 grams of water, 6 drops of HCl and 850 grams of DPG combined and processed into copper clad laminate as previously described.

Sample J was also prepared with about 50 volume % K-90 with an additional 10 volume % FB-35 fused amorphous silica replacing the equivalent volume of PTFE matrix. Sample J consisted of 4147.5 grams of K-90, 339 grams of FB-35, 1320 grams of DuPont T67 PTFE, 40 grams of DC-6124, 11 grams of water, 6 drops of HCl and 714 grams of DPG combined and processed into copper clad laminate as previously described.

The data in table 4 show the same surprisingly large reduction in TCK' with the comparatively small change in formulation. In the present example, the replacement of 10 volume % of PTFE with 10 volume % of FB-35 silica resulted in a six-fold decrease in the TCK' of the K-90 NPO ceramic containing composite. One skilled in the art will appreciate from this example that the reduction of composite CTE is required to reduce the composite's TCK' with any fluoropolymer-low TCK' ceramic composite and is not limited to a specific filler material.

TABLE 4

Example of the use of a higher K' filler other than COG-100 for Low TCK' fluoropolymer composite

| Sample | K' | CTE −55 to +125° C. | TCK' +22 to +250° C. |
|---|---|---|---|
| I | 9.8 | ≈40 ppm/°C. | −239 ppm/°C. |
| J | 12.3 | ≈20 ppm/°C. | −39 ppm/°C. |

EXAMPLE 5

The following example demonstrates that reduction of composite CTE by replacing the PTFE matrix with a mineral or ceramic filler such as silica can significantly reduce the TCK' of high K' filler-containing fluoropolymer composites, even when the high K' filler itself exhibits a high TCK'.

Sample K and L were formulated to have the same approximate $TiO_2$ content and K' as RT/duroid 6006, but with an approximate 26 volume % of the PTFE matrix replaced by an equivalent volume loading of fused amorphous silica. The two samples contained different types of titania filler. Sample K was mixed and prepared as described previously with 2030 grams of SCM "Tionia" titania filler, 850 grams of FB-35, 1308 grams of DuPont T67 PTFE, 35 grams of DC-6124, 10 grams of water, 6 drops of 10% HCl and 700 grams of DPG. Sample L was mixed and prepared as described previously with 2173 grams of Cookson TICON HG $TiO_2$ filler, 850 grams of FB-35, 1308 grams of DuPont T67 PTFE, 35 grams of DC-6124, 10 grams of water, 6 drops of 10% HCl and 700 grams of DPG. The z-axis CTE was measured by the Perkin Elmer thermomechanical analyzer of sample K and inferred to be similar for L due to the similar total filler loading. The K' values of these samples were expected to be about 6.5 based on the formulation. As shown in table 5, the TCK' of both of these samples was reduced by about a factor of two compared to that of RT/duroid 6006. While this improvement would not be sufficient to make a highly desirable microwave circuit substrate, this example clearly demonstrates the importance of CTE control on composite TCK'.

Sample M was formulated to have the same approximate $TiO_2$ content and K' as RT/duroid 6010.2, but with an approximate 10 volume % of the PTFE matrix replaced by an equivalent volume loading of fused amorphous silica. Sample M was mixed and prepared as described previously with 2985 grams of SCM "Tionia" titania filler, 327 grams of FB-35, 1308 grams of DuPont T67 PTFE, 40 grams of DC-6124, 11 grams of water, 6 drops of 10% HCl and 714 grams of DPG.

The measured K' of M was 10.4 by stripline resonance, with a measured CTE of 20.4 ppm/° C. and a TCK' of −221 ppm/° C. This TCK' value is less than half that of the RT/duroid 6010 material with similar K'. Again, while this material would not represent a particularly desirable microwave circuit substrate, it demonstrates the importance of low composite CTE for low composite TCK', even when the high K' filler exhibits a high TCK'.

TABLE 5

Example of the reduction of TCK' of $TiO_2$-fluoropolymer composite by the Reduction of composite CTE

| Sample | K' | CTE −55 to +125° C. | TCK' +22 to +250° C. |
|---|---|---|---|
| RT/duroid 6010.2 | 10.2 | ≈40 ppm/°C. | −525 ppm/°C. |
| RT/duroid 6006 | 6.2 | 74 ppm/°C. | −463 ppm/°C. |
| K | ≈6.5 | 15.7 ppm/°C. | −161 ppm/°C. |
| L | ≈6.5 | ≈16 ppm/°C. | −243 ppm/°C. |
| M | 10.4 | 20.4 ppm/°C. | −221 ppm/°C. |

EXAMPLE 6

The majority of the previous examples of composites with a low TCK' have been achieved with two ceramic or mineral fillers added to the composite. In most of these examples, the larger fraction of the two fillers is the high K', low TCK' low TCK' specified ceramic filler and the smaller fraction is the comparatively low K', low to moderate TCK' ceramic or mineral filler. These recipes were followed to achieve a K' of about 10 and a TCK' of less than 75 ppm/° C.

One skilled in the art will appreciate that if lower or higher composite K' values are desired, the relative fractions of these fillers may be varied. If higher K' with a certain high K', low TCK' ceramic filler is desired, the comparatively low K' filler would not be used and the overall CTE would be controlled by using the largest possible volume loading of the high K' filler.

If lower K' values are desired, than a lower volume fraction of the high K' filler would be used and the low composite CTE would be achieved by increasing the volume fraction of the low K' filler material.

This example demonstrates achieving a low TCK' fluoropolymer composite with a K' value of approximately 6 with about 26.6 volume % of a high K' NPO ceramic filler and 33.4 volume % of the low K' filler, in this case, silica. The example is demonstrated using two different types of NPO ceramic filler.

Sample N was prepared in the manner previously described using 2350 grams of COG-100, 1134.2 grams of FB-35, 1322 grams of DuPont T67 PTFE, 40 grams of DC-6124 11 grams of water, 6 drops of 10% HCl and 714 grams of DPG. Sample O was also prepared in the manner previously described using 2192 grams of the Transelco K-90, 1125 grams of FB-35, 1311 grams of DuPont T67 PTFE, 40 grams of DC-6124 11 grams of water, 6 drops of 10% HCl and 714 grams of DPG.

Figure 6:
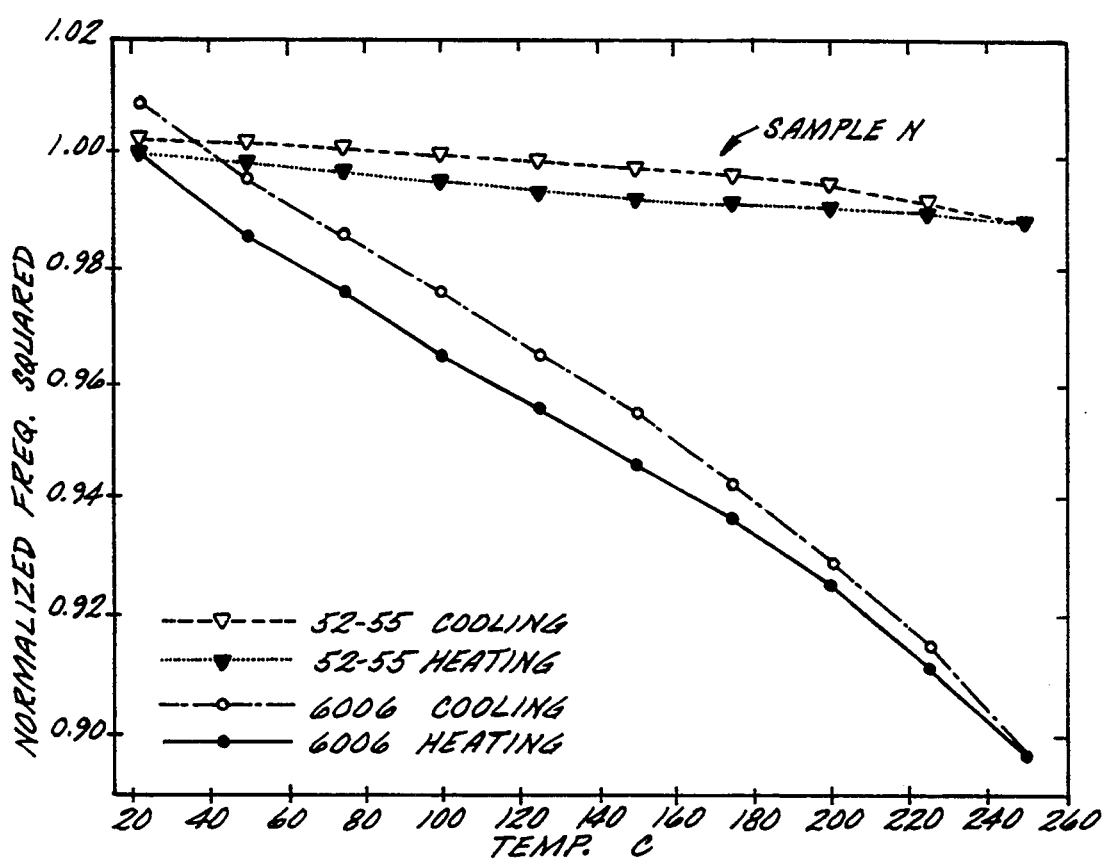
FIG. 6 is a graph comparing TCK' of the present invention to prior art high K' microwave composite materials.

The data in table 6 clearly show achievement of the lower K' value and a TCK' value of approximately 1/10th that of the commercially available RT/duroid 6006. This large improvement in TCK' is shown graphically by comparing the square of the normalized resonant frequencies for sample N and the RT/duroid 6006 sample in FIG. 6.

TABLE 6

Example of low TCK' NPO Ceramic-fluoropolymer composites with a K' of approximately 6

| Sample | K' | CTE −55 to +125° C. | TCK' +22 to +250° C. |
|---|---|---|---|
| RT/duroid 6006 | 6.2 | 74 ppm/°C. | −463 ppm/°C. |
| N | 6.1 | 23.4 ppm/°C. | −48 ppm/°C. |
| O | ≈6.5 | ≈20 ppm/°C. | −55 ppm/°C. |

TABLE 6

Example of low TCK' NPO Ceramic-fluoropolymer composites with a K' of approximately 6

| Sample | K' | CTE −55 to +125° C. | TCK' +22 to +250° C. |
|---|---|---|---|
| RT/duroid 6006 | 6.2 | 74 ppm/°C. | −463 ppm/°C. |
| N | 6.1 | 23.4 ppm/°C. | −48 ppm/°C. |
| O | ≈6.5 | ≈20 ppm/°C. | −55 ppm/°C. |

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical substrate composite material comprising:
    (1) a fluoropolymeric matrix;
    (2) particulate ceramic filler material, said filler material comprising a mixture of;
    (a) at least one first ceramic material having a dielectric constant of $\geq 30$ and a thermal coefficient of dielectric constant with an absolute value of $<500$ ppm/° C.; and
    (b) at least one second ceramic material having a coefficient of thermal expansion of $\leq 15$ ppm/° C., said mixture of ceramic fillers being proportioned in a ratio effective to provide the composite material with a dielectric constant of $\geq 4$ and a thermal coefficient of dielectric constant with an absolute value of $\leq 150$ ppm/° C. over a temperature range that spans 20° C. to 50° C.

2. The material of claim 1 wherein:
    said mixture of ceramic fillers is proportioned in a ratio effective to provide a coefficient of thermal expansion for the composite material of $\leq 35$ ppm/° C.

3. The material of claim 1 wherein:
    said particulate ceramic filler material has a particle size distribution and particle morphology effective to lower the porosity of the electrical substrate material to equal to or less than 15%.

4. The material of claim 1 wherein:
    said fluoropolymeric matrix is present in an amount of between about 60 to 25 volume percent of the total substrate material.

5. The material of claim 1 wherein:
    said filler material is present in an amount of between about 75 to 40 volume percent of the total substrate material.

6. The material of claim 4 wherein:
    said filler material is present in an amount of between about 75 to 40 volume percent of the total substrate material.

7. The material of claim 1 wherein:
    said first ceramic material has a thermal coefficient of dielectric constant in the range of 0 to 30 ppm/° C.

8. The material of claim 1 wherein:
    the composite material has a thermal coefficient of dielectric constant of $\leq 50$ ppm/° C.

9. The material of claim 1 wherein:
    said particulate ceramic filler has a particle size distribution and particle morphology effective to lower the porosity of the electrical substrate material to $\leq 10\%$.

10. The material of claim 1 wherein:
    said second ceramic material is selected from the group consisting of silica, alumina, glasses, steatites, beryllium oxide, aluminum nitride, forsterite ceramics and boron nitride.

11. The material of claim 1 wherein: said second ceramic material includes fused amorphous silica.

12. The material of claim 1 including:
    a hydrophobic coating on said ceramic materials.

13. The material of claim 12 wherein:
    said coating on said ceramic materials is selected from the group consisting of silanes, titanates and zirconates.

14. The material of claim 1 including:
    at least one metal layer on at least a portion of a surface of the composite material.

15. The material of claim 14 wherein:
    the metal layer comprises copper.

16. The material of claim 15 wherein said composite material has a planar shape and includes an X-Y plane and wherein:
    the coefficient of thermal expansion of the composite material is substantially equal to the CTE of the copper.

17. The material of claim 1 wherein:
    said first ceramic material is selected from the group consisting of (1) ReBaPbBiTiO$_3$, (2) neodymium and zinc oxide doped barium titanate and (3) barium nanotitanate.

18. The material of claim 1 wherein:

said fluoropolymeric matrix is selected from the group consisting of polytetrafluoroethylene, a copolymer Of tetrafluoroethylene and perfluoroalkyl vinyl ether, a copolymer of hexafluoropropylene and tetrafluoroethylene, poly(ethylene-co-chlorotrifluoroethylene), poly(chlorotrifluoroethylene), poly(ethylene-co-tetrafluoroethylene) and poly(vinylidene fluoride).

19. An electrical substrate material comprising:
(1) a polytetrafluoroethylene matrix;
(2) particulate ceramic filler material, said filler material comprising a mixture of;
(a) at least one first ceramic material having a dielectric constant of $\leq 30$ and a thermal coefficient of dielectric constant with an absolute value of $<500$ ppm/° C.; and
(b) at least one second ceramic material having a coefficient of thermal expansion of $\leq 15$ ppm/° C., said mixture of ceramic fillers being proportioned in a ratio effective to provide the composite material with a dielectric constant of $\geq 4$ and a thermal coefficient of dielectric constant with an absolute value of $\leq 150$ ppm/° C. over a temperature range that spans 20° C. to 50° C.

20. An electrical substrate composite material comprising:
(1) a fluoropolymeric matrix; and
(2) particulate ceramic filler material, said filler material comprising at least one ceramic material having a dielectric constant of $\geq 30$ and a thermal coefficient of dielectric constant with an absolute value of $<500$ ppm/° C. in an amount effective to provide the composite material with a dielectric constant of $\geq 4$, a thermal coefficient of dielectric constant with an absolute value of $\geq 150$ ppm/° C. and a coefficient of thermal expansion of $\leq 35$ ppm/° C.

21. The material of claim 20 wherein:

said particulate ceramic filler has a particle size distribution effective to lower the porosity of the electrical substrate material to equal to or less than 15%.

* * * * *